United States Patent [19]

Chraplyvy et al.

[11] Patent Number: 4,905,253
[45] Date of Patent: * Feb. 27, 1990

[54] DISTRIBUTED BRAGG REFLECTOR LASER FOR FREQUENCY MODULATED COMMUNICATION SYSTEMS

[75] Inventors: Andrew R. Chraplyvy, Matawan; Thomas L. Koch, Holmdel; Robert W. Tkach, Little Silver, all of N.J.

[73] Assignees: American Telephone and Telegraph Company, New York, N.Y.; AT&T Bell Laboratories, Murray Hill, N.J.

[*] Notice: The portion of the term of this patent subsequent to has been disclaimed.

[21] Appl. No.: 303,526

[22] Filed: Jan. 27, 1989

[51] Int. Cl.[4] .................................. H01S 3/08
[52] U.S. Cl. ............................. 372/96; 372/28; 372/46; 350/96.15; 350/96.17
[58] Field of Search ............... 372/44, 46, 50, 96, 372/26, 28, 102; 357/17, 16, 19; 350/96.15, 96.17, 96.20; 250/227

[56] References Cited

U.S. PATENT DOCUMENTS

| | | | |
|---|---|---|---|
| 3,760,292 | 9/1973 | Kogelnik et al. | 331/94.5 |
| 3,884,549 | 5/1975 | Wang et al. | 350/96 NG |
| 4,023,993 | 5/1977 | Scifres et al. | 148/172 |
| 4,096,446 | 6/1978 | Haus et al. | 331/94.5 |
| 4,618,959 | 10/1986 | Mito | 372/46 |
| 4,648,096 | 3/1987 | Akiba et al. | 372/96 |
| 4,665,528 | 5/1987 | Chinone et al. | 372/96 |
| 4,701,930 | 10/1987 | Akiba et al. | 372/96 |
| 4,719,636 | 1/1988 | Yamaguchi | 372/50 |
| 4,751,710 | 6/1988 | Yamaguchi et al. | 372/50 |

FOREIGN PATENT DOCUMENTS 10133782 7/1985 Japan .................................. 372/43

OTHER PUBLICATIONS

Utaka et al., Room Temperature Operation of GaInAsP/InP Integrated Twin-Guide Lasers with First-Order Distributed Bragg Reflector; conference: Integrated and Guided-Wave Optics Technical Digest Incline Village, NV, USA (28–30 Jan. 1980).

S. Ogita et al., Elec. Lett., vol. 22, No. 11, May 22, 1986, pp. 580–581, "Theoretical Calculation of the Linewidth ...".

S. Ogita et al., Elec. Lett., vol. 23, No. 8, 1987, pp. 393–394, "Linewidth Reduction in DFB Lasers by Detuning Effect".

L. D. Westbrook et al., Elec. Lett., vol. 19, No. 25/26, 1983, pp. 1076–1077. "New Diffraction Grating Profiles in ...".

S. B. Alexander, J. of Lightwave Tech., vol. 7, No. 1, Jan. 1989, pp. 11–23, "Passive Equalization of Semiconductor ...".

S. Kobayashi et al., IEEE J. of Quan. Elec., vol. QE-18, No. 4, Apr. 1982, pp. 582–595, "Direct Frequency Modulation in ...".

(List continued on next page.)

Primary Examiner—William L. Sikes
Assistant Examiner—B. R. R. Holloway
Attorney, Agent, or Firm—Gregory C. Ranieri

[57] ABSTRACT

To overcome the deleterious effects of the nonuniform frequency modulation response in semiconductor lasers due to current injection in direct frequency modulation applications, it has been determined that the linewidth enhancement factor $\alpha$ be made as large as possible. In one embodiment, distributed Bragg relector lasers well suited for frequency modulation lightwave communication systems are designed to have an integrated feedback element such as a corrugation grating whose effective pitch is selected to cause the Bragg wavelength and, therefore, the laser operating wavelength to be longer than the wavelength at substantially the maximum gain or gain peak in the semiconductor structure. That is, the wavelength of the grating is effectively detuned toward the longer wavelength and lower energy side of the peak of the gain profile. Such detuning increases the linewidth enhancement factor in such a way that the nonuniform frequency modulation response and its effects are minimized and, in some cases, substantially eliminated.

4 Claims, 3 Drawing Sheets

OTHER PUBLICATIONS

Y. Yoshikuni et al., J. of Lightwave Tech., vol. LT-5, No. 4, Apr. 1987, pp. 516-522, "Multielectrode Distributed Feedback Laser for . . . ".

Vodhanel et al., J. of Lightwave Tech., vol. LT-5, No., 4, Apr. 1987, p. 461, "FSK Heterodyne Transmission . . . ".

Emura et al, J. of Lightwave Tech., vol. LT-5, No. 4, Apr. 1987, pp. 469-477, "System Design and Long-Span Transmission . . . ".

Saito et al., IEEE J. Quan. Elec., vol. QE-19, No. 2, 1983, pp. 180-193, "S/N and Error Rate Evaluation for an Optical . . . ".

Kikuchi et al., J. Lightwave Tech., vol. LT-2, No. 6, Dec. 1984, pp. 1024-1033 "Degradation of Bit-Error Rate in Coherent . . . ".

C. H. Henry, IEEE J. of Quan. Elec., vol. QE-18, No. 2, Feb. 1982, pp. 259-164, "Theory of the Linewidth of Semiconductor Lasers".

K. Vahala et al., Appl. Phys. Lett., 42 (8), Apr. 15, 1983, pp. 631-633, "On eht Linewidth Enhancement . . . ".

K. Kikuchi et al., Elec. Lett., vol. 24, No. 13, Jun. 23, 1988, pp. 821-822, "Measurement of Linewidth Enhancement Factor of . . . ".

DISTRIBUTED BRAGG REFLECTOR LASER FOR FREQUENCY MODULATED COMMUNICATION SYSTEMS

TECHNICAL FIELD

This invention relates to the field of lightwave systems for frequency modulation in which the system employs a single frequency distributed Bragg reflector laser.

BACKGROUND OF THE INVENTION

Future lightwave systems are expected to accommodate large numbers of transmission channels separated by small guard bands. The transmission channels operating at high data rates are planned to utilize more fully the existing available bandwidth of single mode optical fibers for delivery of network and other services such as entertainment television. As system planners continue to make trade-offs between design parameters such as coherent and non-coherent approaches, direct and heterodyne detection techniques and the like, it is increasingly apparent that frequency modulation of a single frequency light source such as a distributed feedback (DFB) laser or distributed Bragg reflector (DBR) laser has become an attractive approach for the lightwave transmitter design.

Frequency modulation is often preferred over amplitude or intensity modulation at high data bit rates because chirping and current switching problems, both of which arise from current variations on the light source, decrease the desirability of amplitude and intensity modulation systems. For intensity modulation, large amounts of current must be switched rapidly to the light source. The amount of drive current is typically in the range of 30–60 mA for semiconductor lasers. As the current to the semiconductor laser varies, it causes a small but significant amount of frequency modulation in the laser called chirp. Chirping causes a broadening of the spectral linewidth of emitted radiation. Obviously, such spectral spreading penalizes even the best single frequency light sources. Semiconductor lasers especially single frequency lasers (DFB and DBR) have been improved through better fabrication techniques to have a lower linewidth enhancement factor and, thereby, a reduced susceptibility to chirping. Even with such improved light sources, lightwave systems employing amplitude and intensity modulation may have substantial drawbacks when compared with frequency modulation lightwave systems.

The appeal of frequency modulation for lightwave communication systems can be related to the fact that it permits a simplified transmitter design. By directly modulating or varying the injection current to a semiconductor laser, it is possible to modulate the frequency of the laser. For single frequency semiconductor lasers, the carrier density effect which shows a change of frequency with injection current, $\Delta f/\Delta i$, is sufficiently large, generally, several hundred Mhz/mA, to minimize residual intensity modulation effects for the frequency excursions required by most FM systems. However, nonuniformity exists for the FM response of such lasers over the modulation bandwidth because of competition between temperature and carrier density effects on the laser frequency.

Nonuniform FM response is viewed with respect to thermal cutoff of the single frequency laser. Below the thermal cutoff frequency, the FM response is extremely large in magnitude on the order of Ghz/mA whereas it is opposite in phase to the FM response above the thermal cutoff frequency. Far above the thermal cutoff frequency, the FM response approaches several hundred Mhz/mA while gradually reversing phase with respect to that below the thermal cutoff frequency. As a result, lower frequency components of a modulated optical signal undergo severe waveform distortion due primarily to temperature or thermal modulation effects on the active region of the laser.

Frequency modulation based lightwave communication systems using lasers whose FM response is nonuniform suffer degradation. In an Mary FSK systems, nonuniform FM response causes drift of a transmitted frequency representing one of M levels per symbol whenever the laser remains at that frequency for a time which is significant as compared to a thermal time constant for the laser. As the frequency drifts, crosstalk increases resulting a degraded bit error rate performance and, ultimately, causes complete failure of the affected link for the lightwave system.

These problems can be ameliorated to some degree by limiting the length of non-alternating data patterns to effectively eliminate the low frequency components of the data sequence. There are other approaches commonly employed for working with the nonuniform FM response of the laser which employ a modulation format or data encoding scheme to also avoid the low frequency modulation region. In one example, Manchester coding is employed with its concomitant penalty of increased system bandwidth requirements. Additionally, problems such as power consumption and device complexity preclude the use of most encoding and modulation techniques. Active and passive equalization networks have been combined with DFB lasers to overcome distortion induced by the nonuniform FM response of the DFB laser. In theory, these networks compensate the nonuniform FM response of the DFB laser by using combined pre-distortion, post-distortion and feedback control methods to realize a somewhat uniform FM response. Both active and passive equalization techniques generally result in relatively small FM response and, therefore, increased drive current requirements. While the combination appears to have a uniform FM response, it is important to realize that the DFB laser itself exhibits a totally nonuniform FM response.

Phase-tunable DFB lasers have also been proposed to overcome the nonuniform FM response problem. These devices are generally fabricated to include two distinct regions: a DFB region for operating as a standard DFB laser and a modulation region without a grating separately contacted for modulating the DFB laser signal. In this way, carrier density effects are artificially controlled through electrode partitioning to achieve quasi-uniform FM response and chirp suppression. Quasi-uniform FM response for two-electrode DFB lasers is reported up to several hundred megahertz. However, DFB regions employed in these devices exhibit unwanted nonuniform FM response and are primarily designed to have inherently low linewidth enhancement factors for chirp suppression. Multisection DBR lasers have been demonstrated to have somewhat uniform FM response when modulation drive current is applied to the passive sections (grating and phase control regions) of the laser. However, the response speed of such DBR lasers operated in the above-described mode is limited by free carrier recombination effects. If modulation were applied soley to the gain region of such DBR lasers, the same problems which occur for DFB lasers are experienced. Moreover, design and fabrication complexity caused by the multi-section structure may diminish its desirability for use in future lightwave systems.

While the alternatives described above have been proposed and demonstrated for dealing with the nonuniform FM response of directly modulated lasers, in particular, DFB lasers, it has been noted recently that "[t]he potentially most rewarding solution is to construct a laser having an inherently uniform FM response." *J. of Lightwave Tech.*, Vol. 7, No., 1, pp. 11–23 (January 1989). As noted in the descriptions above, each laser element still exhibits an inherent nonuniform FM response. Upon realizing this fact, the authors of the above-cited article lament as follows, "[u]nfortunately, the goal of obtaining single mode operation, high output power, narrow linewidth, long life, along with a uniform FM response, in a wide selection of commercial devices at various wavelengths, is still elusive."

SUMMARY OF THE INVENTION

Single mode operation and uniform FM response are achieved in a frequency modulation transmitter for a lightwave system in accordance with the principles of the present invention by frequency modulating a distributed Bragg reflector laser having a feedback structure optically coupled to a gain region. The gain region comprises a gain medium having a characteristic wavelength. The feedback structure is realized as an exemplary Bragg reflector region having a modal or effective index of refraction (n). The feedback structure controls the laser to emit lightwave signals at a Bragg wavelength $\lambda_B$ which is greater than the characteristic wavelength. In the resulting lightwave transmitter of frequency modulated signals, the distributed Bragg reflector laser operates with an increased carrier density effect and, thereby, a higher linewidth enhancement factor than that at substantially the gain peak wavelengths. As a result, the laser has a uniform FM response while maintaining single mode operation.

In one embodiment of the invention, the feedback structure in the distributed Bragg reflector laser includes a corrugation grating wherein the grating exhibits an effective grating period $\Lambda_{eff}$ related to the Bragg wavelength as $\lambda_B = 2n\Lambda_{eff}/M$ for M being an integer greater than or equal to one and identifying the order of the grating. According to the principles of the present invention, the Bragg wavelength $\lambda_B$ is selected to be greater than the characteristic wavelength of the gain medium.

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Figure 1:
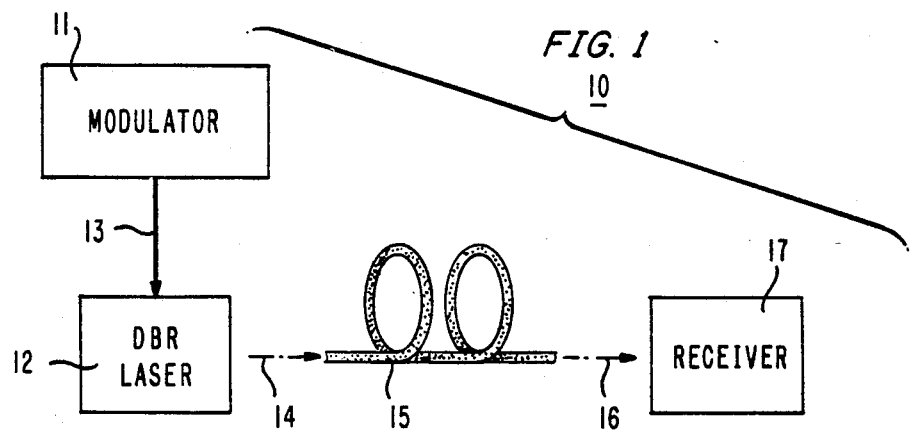
FIG. 1 is a simplified schematic diagram of a frequency modulation lightwave communication system.

FIG. 1 shows a simplified schematic diagram of lightwave communication system 10 employing frequency modulation at a transmitter location. Lightwave communication system 10 includes a transmitter for generating and supplying frequency modulated signal 14 to transmission medium 15, transmission medium 15 for supporting propagation of lightwave signals from a local location to a remote location, and receive 17 for obtaining lightwave signal 16 from transmission medium 15. Remote is intended to means any location away from the transmitter either in a microscopic sense such as being co-located on the same semiconductor chip or in a macroscopic sense such as being geographically separated.

The transmitter comprises modulator 11 connected via path 13 to distributed Bragg reflector (DBR) laser 12. Modulator 11 provides frequency modulation of DBR laser 12 so that lightwave signal 14 is generated as a frequency modulated signal. As contemplated, modulator 11 may be electrically connected to DBR laser 12 for direct modulation by varying the current applied to the laser. Alternatively, modulator 11 may be optically connected to DBR laser 12 as an in-line element for frequency modulating lightwave signals generated by DBR laser 12.

Frequency modulation is understood to include all forms of frequency modulation whether analog or digital. Hence, use of specific terms such as FM (frequency modulation) or FSK (frequency-shift-keying) is intended to help the reader understand the principles of an embodiment of the invention without being limiting to the scope of this invention. Moreover, the term FSK is understood to include variations such as binary FSK and M-ary FSK. Finally, it is contemplated that other modulation techniques such as intensity modulation, either continuous (AM or IM) or discrete (M-ary ASK, M=2,3, ... ), and phase modulation, either continuous (PM) or discrete (M-ary PSK, M=2,3, ... ), may be used in conjunction with frequency modulation without departing from the spirit and scope of the principles of the present invention.

Transmission medium 15 provides a propagation path for lightwave signals betwen the lightwave transmitter and the lightwave receiver. In general, transmission medium 15 is understood to include dielectric waveguides such as optical fiber, semiconductor waveguides, metal-indiffused lithium niobate or lithium tantalate waveguide elements, and the like. Of course, other elements such as combiners, couplers, start distribution networks, switching elements, optical amplifiers, signal regenerators, reconditioners, and repeaters, and the like may be present within the transmission medium 15 without any loss of generality or applicability for the principles of the present invention. In its simplest embodiment, transmission medium 15 supports optical propagation of an input signal, lightwave signal 14, until an output signal, lightwave signal 16, is ultimately delivered to the receiver at the remote end of the transmission medium.

Receiver 17 accepts lightwave signal 16 from the transmission medium. Based upon the system architecture and the actual function of the receiver, receiver 17 operates on received lightwave signal 16 in a prescribed manner. For example, the receiver may provide coherent detection via homodyne or heterodyne reception of lightwave signal 16. The need for local oscillators at the receiver may be eliminated by including in M−1 bandpass optical filters such as Fabry-Perot filters tuned to M−1 different wavelengths included in lightwave signal 14, an M-ary FSK signal. In the latter configuration, the M-ary FSK signal is detected and output as an M-ary ASK signal.

It is understood by those skilled in the art that lightwave system 10 may be included without any loss of generality in a larger lightwave system such as a wavelength division multiplexed (WDM) system or the like.

Embodiments of the modulator, transmission medium and receiver described above are well known to those skilled in the art. Accordingly, further discussion will provide a more detailed description of the transmitter and, particularly, DBR laser 12.

Figure 2:
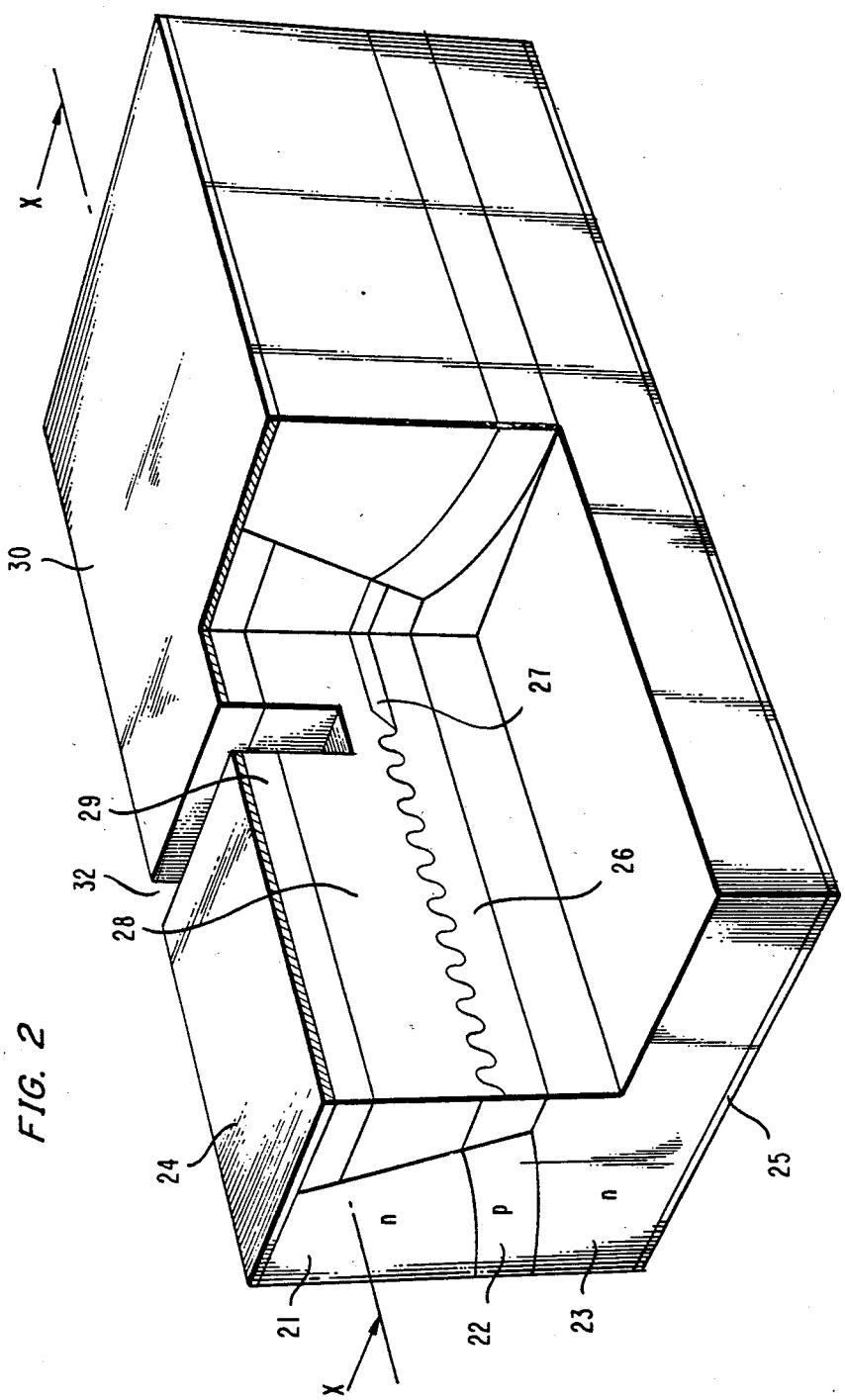
FIG. 2 is a perspective cross-sectional and cutaway view of a distributed Bragg reflector semiconductor laser for use in the lightwave system of FIG. 1 in accordance with the principles of the invention.

FIG. 2 shows a perspective cross-section and cutaway view of an exemplary distributed Bragg reflector semiconductor laser for use as DBR laser 12 in lightwave system 10 in accordance with the principles of the invention. The DBR laser shown in FIG. 2 is a buried heterostructure having a reversed-bias p-n blocking region. Other structures such as bured ridge, crescent or V-groove, double channel planar buried heterostructure, semi-insulating blocking region planar buried heterostructure and the like are contemplated for use as embodiments of DBR laser 12.

Semiconductor structures such as the one shown in FIG. 2 are grown using epitaxial growth techniques such as liquid phase epitaxy, molecular beam epitaxy, chemical beam epitaxy and vapor phase epitaxy. These techniques are described in the literature and are well known to those skilled in the art. See, for example, H. C. Casey et al., *Heterostructure Lasers*, Vols. A and B, Academic Press (1978). Also, see U.S. Pat. No. 4,023,993 for a description of a method for making a distributed feedback laser which is similar to the laser heterostructure in the FIGs.

As shown in FIG. 2, the DBR laser includes an n-type Sn:InP substrate 23 on which the reversed-bias p-n blocking region and the buried heterostructure are grown. Contact layers 24, 30 and 25 are shown as broad area metallic contacts deposited on top and bottom (contact 25) surfaces of the DBR laser for biasing and current injection. Current injection is optional for the Bragg reflector region via contact 24. Standard ohmic contact fabrication techniques such as multi-layer evaporation of metal films, alloy evaporation, sputtering and annealing may be employed to realize the ohmic contacts for the particular DBR laser. In the laser shown in FIG. 2, contacts 24 and 30 are standard Au-Zn contacts whereas contact 25 is an evaporated Au-Ge-Ni contact.

Using standard epitaxial growth techniques, a heterostructure is grown on substrate 23 in the following order: an additional n-type Sn:InP buffer layer (not shown) approximately 1 μm thick; an n-type guide layer 26 comprising $Sn:In_xGa_{1-x}As_yP_{1-y}$ approximately 0.3 μm thick and having suitable mole fractions x, y for approximately 1.3 μm; an undoped quaternary ($In_xGa_{1-x}As_yP_{1-y}$) active layer 27 approximately 0.1 μm thick and having suitable mole fractions x and y to produce a characteristic wave length $\lambda_p$ substantially at the peak of the gain profile curve as desired—in this example, the characteristic wavelength is selected to be approximately 1.51 μm; a p-type Zn:InP cladding layer 28 approximately 3 μm thick; and p-type quaternary cap layer 29 approximately 0.7 μm thick. Standard pipe masking using photolithography and etching techniques (for example, bromine methanol etch) are employed to produce the heterostructure mesa.

An intermediate step in the process is to remove a portion of the active layer 27 from the Bragg reflector region and to place a corrugation, for example, on the surface of layer 26 in the Bragg reflector region using standard masking and etching techniques.

After the heterostructure mesa is formed, successive growth steps for p-blocking layer 22 and n-blocking layer 21 are performed over the substrate 25. Blocking layer 22 comprises Zn:InP approximately 0.5 μm thick and blocking layer 21 comprises Sn:InP to a thickness sufficient to substantially planarize the entire semiconductor structure for contacting.

It is understood that isolation groove 32 is formd by etching, for example, a portion of the heterostructure to create electrical isolation between the Bragg reflector region and the gain region. Other techniques such as ion implantation and the like are contemplated for use in place of the isolation groove 32.

It is understood that dopant concentrations of approximately $10^{17}$ to $10^{18}$ cm$^{-3}$ are suitable for the Sn and Zn dopants in the layers of the DBR laser described above. After final preparation, the laser is cleaved to produce at east two end facets in planes perpendicular to a direction of light propagation supported in the heterostructure. Since the laser shown has a corrugation grating as the integrated feedback structure between the facets, it is generally acceptable practice to apply anti-reflection coatings to the at least two end facets to reduce end facet reflections to a minimum.

Figure 3:
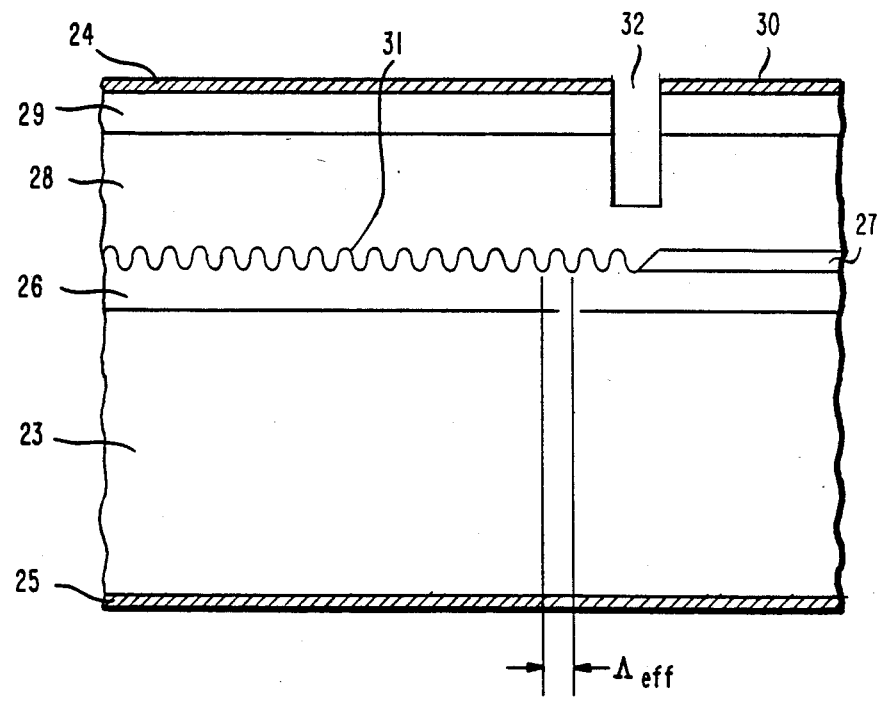
FIG. 3 is a cross-sectional view of an alternative embodiment of the laser from FIG. 2 viewed through section line X—X.

Also shown in FIGS. 2 and 3, the feedback strucutre of the DBR laser includes a corrugation grating 31 which is formed in guide layer 26. Shape, depth and pitch or period of the grating are variable and depend on the grating placement together with the result desired therefrom.

In principle, the feedback structure of the DBR laser includes spatially periodic perturbations in the transmission characteristics of the laser waveguide formed substantially continuously along the direction of lightwave propagation in the laser waveguide and substantially transverse to the propagation direction of optical energy in the waveguide. Spatially periodic perturbations of the transmission characteristic of the waveguide may take the form of variations in gain, index of refraction, propagation constant, or other parameter of the waveguide medium for the laser.

In accordance with the principles of this invention, the period of the grating effective over the guiding region of the laser in the Bragg reflector region is given as an effective period, $\Lambda_{eff} > \lambda_p M/2n$, where $\lambda_p$ is the characteristic wavelength substantially at the gain peak of gain maximum for the gain region of the semiconductor structure, M is the order of the grating expressed as an integer greater than or equal to one, and n is the modal or effective index of refraction for the waveguide mode of the semiconductor laser. It is contemplated that, while transverse positioning of the grating lines is desired, an angular displacement (twist) of the grating lines may occur so that the grating lines lie substantially transverse to the direction of lightwave propagation for the DBR laser.

It is contemplated that first (M=1) or higher order (M=2,3, . . . ) integrated feedback structures such as corrugation gratings may be utilized. Such gratings may be fabricated using standard electron beam, photolithographic and/or holographic patterning techniques with the necessary subsequent wet or dry etching steps. The grating shape may be sinusoidal as shown in FIGS. 2 and 3 or triangular, rectangular, trapezoidal, semi-circular or some other known complex function. For various grating profiles and fabrication techniques, see *Elect. Lett.*, Vol. 19, No. 25/26, pp. 1076-7 (1983).

Positioning of the grating with respect to the guide layer can be varied so that the grating may be on the substrate below the guide layer, or on the guide layer, or on some other layer near the guide layer in the Bragg reflector region. Of course, grating coupling strength must be considered when selecting a grating position because the grating coupling strength is determined by the grating position vis-a-vis the waveguide mode, the grating or corrugation depth measured from peak to trough, and the difference between refractive indices for the materials bounding the corrugation or grating.

In the exemplary embodiment shown in FIGS. 2 and 3, a first order grating is shown with an effective period $\Lambda_{eff}$ which satisfies the criterion described above for detuning the grating to be at a wavelength which is longer than the gain peak or gain maximum wavelength as described above mathematically. The corrugation grating shown in the FIGs. has a pitch of approximately 2384 Å and a depth of approximately 800 Å. This grating was chosen to achieve detuning of approximately 400 Å from a gain peak wavelength of approximately 1.51 b$\mu$m ($\lambda_p$) to an operating wavelength of 1.55 $\mu$m ($\lambda_B$).

In order to accomplish this detuning, it is necessary to select the amount of wavelength detuning desired. Using standard calculation techniques which are well known to those skilled in the art, the modal index of refraction of the laser structure is determined using the compositions and layer dimensions for the DBR laser. Index values are obtained from *IEEEE J. of Quant. Elect.*, QE-21, pp. 1887 et seq. (1985).

Detuning the grating period to be such that the Bragg wavelength is longer than the wavelength of the gain peak for the semiconductor material causes the resulting DBR laser to have an unusually large linewidth enhancement factor, $\alpha$. For general discussion of measurement of the linewidth enhancement facor, see the following articles: *IEEE J. of Quant. Elect.*, QE-18, pp. 259 et seq. (1982); *Appl. Phys. Lett.*, 42 (8), pp. 631 et seq. (1983); *Elect. Lett.*, 23, pp. 393-4 (1987); and *Elect. Lett.*, 22, pp. 580-1 (1986). As a result of proper detuning in accordance with the principles of the invention, the resulting DBR laser provides a large carrier-mediated FM response for reducing current drive requirements and also for flattening the FM response to be substantially uniform.

Figure 4:
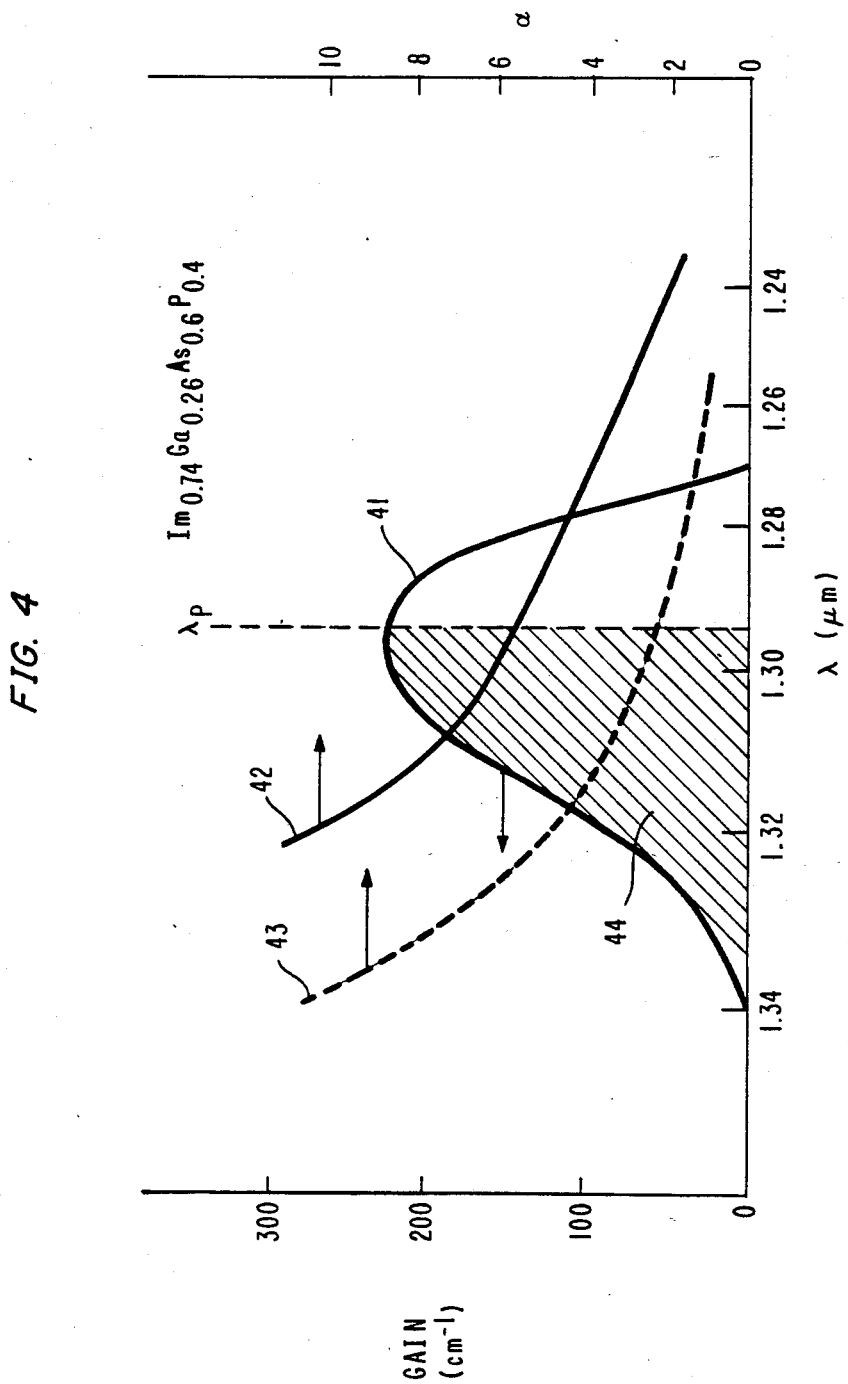
FIG. 4 is a plot of the linewidth enhancement factor and the gain envelope as a function of wavelength.

FIG. 4 shows a combined plot of linewidth enhancement factor versus wavelength (curves 42 and 43) and gain versus wavelength (curve 41). The active layer was designed to be quaternary III–V semiconductor material, InGaAsP, with mole fractions x=0.74 and y=0.6 so that $\lambda_p$ is slightly less than 1.3 $\mu$m. The linewidth enhancement factor is shown to increase with increasing wavelength for a buried heterostructure DBR laser in curve 42 and a multiple quantum well DBR laser in curve 43. That is, each DBR laser exhibits more chirp with increasing wavelength. Shaded region 44 depicts those wavelengths to which the integrated feedback structure such as a Bragg grating may be tuned for the DBR laser so that the operating wavelength of the laser ($\lambda_B$) is greater than the gain peak wavelength of achieving large linewidth enhancement and excellent direct current frequency modulation operation.

It is understood that, while the material system InGaAsP/InP is described above for fabricating the distributed feedback laser, other material combinations may be selected from other semiconductor Group III-V systems such as GaAs/AlGaAs, InGaAs/InAlAs, InGaAs/InGaAlAs, GaAsSb/GaAlAsSb and GaAs/AlAs. In these semiconductor systems, the layers may be lattice-matched to suitable GaAs or InP substrates. Mismatching is also contemplated wherein strained layers are grown over the substrate material. Finally, extension of the device structures is also contemplated to semiconductor compounds in Group II-VI.

We claim:

1. A lightwave transmitter including a distributed Bragg reflector laser and means for frequency modulating said laser, said laser comprising first and second semiconductor heterostructure regions, said first region optically coupled to said second region along a propagation direction for lightwave signals supported therein, said first region including a gain medium having a characteristic wavelength $\lambda_p$, and said second region having a modal refractive index n and including an integrated feedback means, said integrated feedback means including spatially periodic perturbations of a transmission characteristic of said second semiconductor heterostructure region and having an effective period $\Lambda_{eff}$, said transmitter CHARACTERIZED IN THAT, said effective period is related to said characteristic wavelength as $\Lambda_{eff} > \lambda_p M/2n$, where M is an integer greater than or equal to 1 for characterizing an order of the integrated feedback means.

2. A lightwave transmitter including a distributed Bragg reflector laser and means for frequency modulating said laser, said laser comprising first and second semiconductor heterostructure regions, said first region optically coupled to said second region along a propagation direction for lightwave signals supported therein, said first region including a gain medium having a characteristic wavelength $\lambda_p$, and said second region including an integrated feedback means, said integrated feedback means including spatially periodic perturbations of a transmission characteristic o said second semiconductor heterostructure region and having an effective period for causing the laser to operate at a Bragg wavelength $\lambda_B$, said transmitter characterized in that, said Bragg wavelength is greater than said characteristic wavelength.

3. A lightwave communication system comprising a lightwave transmitter, a lightwave receiver and a transmission medium optically coupled jointly to said lightwave transmitter and said lightwave receiver for supporting lightwave signal propagation therebetween, said lightwave transmitter including a distributd Bragg reflector laser and means for frequency modulating said laser, said laser comprising first and second semiconductor heterostructure regions, said first region optically coupled to said second region along a propagation direction for lightwave signals supported therein, said first region including a gain medium having a characteristic wavelength $\lambda_p$, and said second region having a modal refractive index n and including an integrated feedback means, said integrated feedback means including spatially periodic perturbations of a transmission characteristic of said second semiconductor heterostructure region and having an effective period $\Lambda_{eff}$, said transmitter CHARACTERIZED IN THAT, said effective period is related to said characteristic wavelength as $\Lambda_{eff} > \lambda_p M/2n$, where M is an integer greater than or equal to 1 for characterizing an order of the integrated feedback means.

4. A lightwave communication system comprising a lightwave transmitter, a lightwave receiver and a transmission medium optically coupled jointly to said lightwave transmitter and said lightwave receiver for supporting lightwave signal propagation therebetween, said lightwave transmitter including a distributed Bragg reflector laser and means for frequency modulating said laser, said laser comprising first and second semiconductor heterostructure regions, said first region optically coupled to said second region along a propagation direction for lightwave signals supported therein, said first region including a gain medium having a characteristic wavelength $\lambda_p$, and said second region including an integrated feedback means, said integrated feedback means including spatially periodic perturbations of a transmission characteristic of said second semiconductor heterostructure region and having an effective period for causing the laser to operate at a Bragg wavelength $\lambda_B$, said transmitter characterized in that, said Bragg wavelength is greater than said characteristic wavelength.

* * * * *